May 30, 1961

J. A. SWANSON ET AL

PHOTOVOLTAIC CELL

Filed Oct. 17, 1955

2,986,591

INVENTORS
JOHN A. SWANSON
PAUL V. HORTON

BY P. E. Henninger

ATTORNEY

United States Patent Office 2,986,591

Patented May 30, 1961

2,986,591

PHOTOVOLTAIC CELL

John A. Swanson and Paul V. Horton, Poughkeepsie, N.Y., assignors to International Business Machines Corporation, New York, N.Y., a corporation of New York Filed Oct. 17, 1955, Ser. No. 540,925

11 Claims. (Cl. 136—89)

This invention relates to photovoltaic cells. Particularly, it relates to photovoltaic cells using semi-conductive material as the photo-sensitive element.

It has been observed that a PN junction in semi-conductive material is sensitive to the presence of radiant energy, either in the visible or invisible spectrum. This sensitivity takes the form of a decrease in the apparent impedance of a reversely biased junction when radiant energy is directed on the junction. It is considered that this decrease in impedance is brought about by the transfer of energy from the light to some of the electrons in the material, shifting the latter from the valence band to the conduction band, with the concomitant production of hole-electron pairs. The holes and electrons so produced are separated by the electric field due to the reverse bias potential, with a resultant increase in current flow. Commonly, in such devices of the prior art, the energy supplied to the electric circuit by the source of biasing potential is much greater than the energy supplied by the light, and the principal effect is thus a change in impedance rather than an energy conversion.

In typical photo-sensitive devices using PN junctions, the light impinges on the junction in a direction generally parallel to the plane of the junction. Only the light striking the junction itself is efficient in producing a current, although light striking the semi-conducting material within a diffusion length of the junction may be partially effective. Since typical PN junctions are relatively narrow as compared to the width of the P and N regions, then if the incident light is spread over the entire semi-conductor surface, only a very small portion of the light strikes the junction. Consequently, such a device is very inefficient in converting light energy into electrical energy, unless provision is made for focusing the incident light into a very narrow line along the junction.

It has been suggested to make a PN junction photocell using a very thin surface P-type layer upon a base of N-type material (or a thin N-layer upon a base of P-type material), and allowing the light to fall perpendularly upon the surface layer. Such an arrangement has the advantage that the incident light can be spread over a larger area. However, in the devices of the type just described, any incident radiant energy which is capable of deep penetration may pass completely through the semi-conductive body which includes the PN junction without being converted into electrical energy.

Devices constructed in accordance with the present invention have the advantage mentioned above for certain types of prior art devices, i.e., that the incident light may be spread over a substantial area. However, the present invention secures that advantage by means of a novel structure. Furthermore, according to a modification of the invention light energy which passes through the semi-conductive body may be subsequently converted to electrical energy.

An object of the present invention is to provide an improved photovoltaic cell which will efficiently convert radiant energy into electrical energy.

Another object is to provide a photocell which may receive light efficiently over a surface having substantial dimensions in two directions, and which does not require focusing of the light shining on it.

Another object of the invention is to provide a photocell which will efficiently convert light of a particular wave length into electrical energy.

The foregoing objects are attained in the structures described herein by providing a body of semi-conductive material including a central region of intrinsic material between two spaced contact regions respectively of N-type and P-type material, said contact regions joining said intrinsic region at barrier junctions.

If light of the proper frequency falls on the intrinsic region, then hole-electron pairs are produced. The electrons find it harder to cross the junction of P-type material and I-type material, where there is a barrier to the flow of electrons, than to cross the junction of I-type and N-type material, where there is no barrier to their flow. Hence electrons flow toward the N-type end. Similarly, holes tend to flow toward the P-type end. The result is a net electric current flowing toward the P-type end. If the body is open-circuited, a potential will build up between the P end and the N end. The magnitude of this potential approaches the width $V_g$ (in electron volts) of the forbidden band of the semi-conductor. By connecting a suitable impedance between terminals connected to the P and N regions, the product of current and voltage produced by the device may be maximized. If the light is sufficiently intense, and if the width of the intrinsic region W is much less than a length $L^\tau$ which depends on the lifetime in a manner described in detail below, then the output voltage at optimum current may be maintained at a value near this maximum, $V_g$. If the light has a frequency such that each light photon has energy slightly greater than the minimum required to raise an electron from the valence band through the forbidden band to the conduction band, and if negligible light is reflected or falls outside the I region, the device then has a conversion efficiency approaching unity. The average lifetime of holes in the intrinsic material must be sufficiently high so that the fraction of holes and electrons which recombine before reaching the contact regions is small.

Other objects and advantages will become apparent from a consideration of the following description and claims, taken together with the accompanying drawing.

Figure 1:
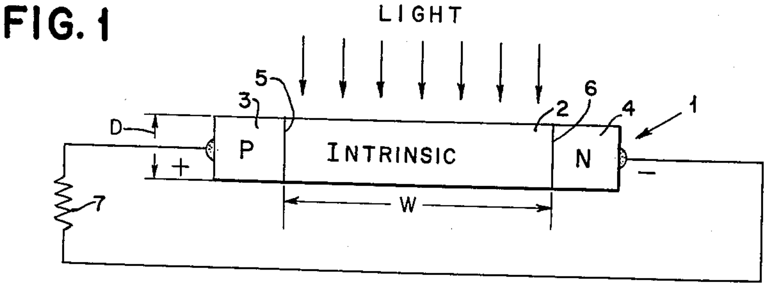
Fig. 1 is a schematic illustration of a photovoltaic cell constructed in accordance with the invention, and connected in a simple circuit.

Referring to the drawing, there is shown a semi-conductive body 1 including a central intrinsic region 2 and having a P-type region 3 at its left hand end and an N-type region 4 at its right hand end. The P-type region 3 is separated from the intrinsic region 2 by a barrier junction 5. The N-type region 4 is separated from the intrinsic region 2 by a barrier junction 6.

Ohmic connections are made to each of the P and N regions 3 and 4, and these connections are connected through suitable wires to a resistor 7.

It is desirable to make the junctions 5 and 6 as effective barriers as possible against the passage of electrons and holes, respectively. For that purpose, it is desirable to make the difference between the resistivity of the I region on the one hand and the P and N regions on the other hand as great as possible. The resistivity of the I region is determined by the physical characteristics of the material, being for germanium, usually in the range of 50 to 60 ohm-centimeters. It is desirable to make the resistivities of the P and N regions as low as possible consistent with sufficiently long lifetime. Resistivities of the order of 1 ohm-centimeter for both the P region and the N region are suggested for germanium. The lifetime of the material in the I region 2 should be as long as possible.

The dimensions for the intrinsic region 2 illustrated in the drawing are schematic only. The distance W between the barrier junctions 5 and 6 should be not substantially greater and preferably should be substantially smaller than a distance $L^{\tau}$, hereinafter termed the "transport length," and defined by the following equation:

$$L^{\tau}=\sqrt{\mu V_g \tau}$$

where $\mu$ is the average carrier mobility in cm.$^2$/volt-second, $V_g$ is the width of the forbidden energy band in electron volts, and $\tau$ is the overall carrier lifetime in seconds. By "overall carrier lifetime" is meant the lifetime taking into account the loss of carriers from all causes, including bulk recombination, surface recombination and loss of carriers by conduction through the barrier junctions.

The transport length $L^{\tau}$ is greater than the diffusion length. In the case of germanium, $L^{\tau}$ is greater than the diffusion length by a factor of 5 or 6. Furthermore, it should be remembered that the diffusion length in an intrinsinc region is usually much larger than the diffusion length in a typical extrinsic region, since the carrier lifetime in pure (i.e. intrinsic) material is usually larger.

The thickness D of the intrinsic region 2, i.e. its dimension measured in the direction of the incident light, should be as small as possible, subject to the limitation that it should in most cases be greater than the depth of penetration of the incident radiation, and also sufficient to keep the effective carrier lifetime due to surface recombination much greater than the carrier lifetime due to volume recombination. Since the surface recombination criterion usually requires a thickness greater than that required by the depth of penetration limitation, it is the requirement for minimizing of surface recombination that, in most practical cases, controls the thickness.

To explain more completely, the surface recombination velocity $s$ is important in thin bodies because the ratio of surface to volume is large. The effective lifetime, $\tau_S$, due to surface recombination, is of the order of magnitude $$\tau_s=\frac{D}{s} \qquad (1)$$

where D is the thickness of the material. It is desired to keep $\tau_S >> \tau$ (the volume lifetime) so that the latter will determine the transport length mentioned above, without having that length reduced by a high surface recombination rate.

Equation 1 may be rewritten $$D=S\tau_S \qquad (2)$$

Therefore, if $\tau_S >> \tau$, it follows that $$S\tau_S >> {}_s\tau \qquad (3)$$

and hence that $$D >> {}_s\tau \qquad (4)$$

Since ${}_s\tau$ is usually greater than the penetration depth of the light, then substantially all the carriers are created at one surface or within the penetration depth of that one surface. These carriers diffuse throughout the body and recombine throughout the body. Consequently, the maximum carrier density is created when D is at its minimum. But the potential $V_o$ increases as the carrier density increases. Consequently, maximum efficiency will be obtained by making D as small as possible consistent with Equation 4.

The surfaces of the intrinsic region 2 may be treated, as by certain etching processes known in the art, to reduce the surface recombination rate $s$.

Light at certain very narrowly defined frequencies may have photon energy just sufficient to create hole-electron pairs in a given material, and may consequently result in a large penetration distance in that material. In such a situation, the thickness D should be made equal to the penetration distance, rather than being determined by the expression set forth above.

There is no limitation on the length, i.e. the dimension perpendicular to plane of the paper, of the semi-conductive body 1. It may be chosen arbitrarily.

Radiant energy having a wave length so short that the energy of each light quanta is less than the energy gap of the intrinsic material will not be converted to electrical energy.

Figures 2A, 2B, 3:
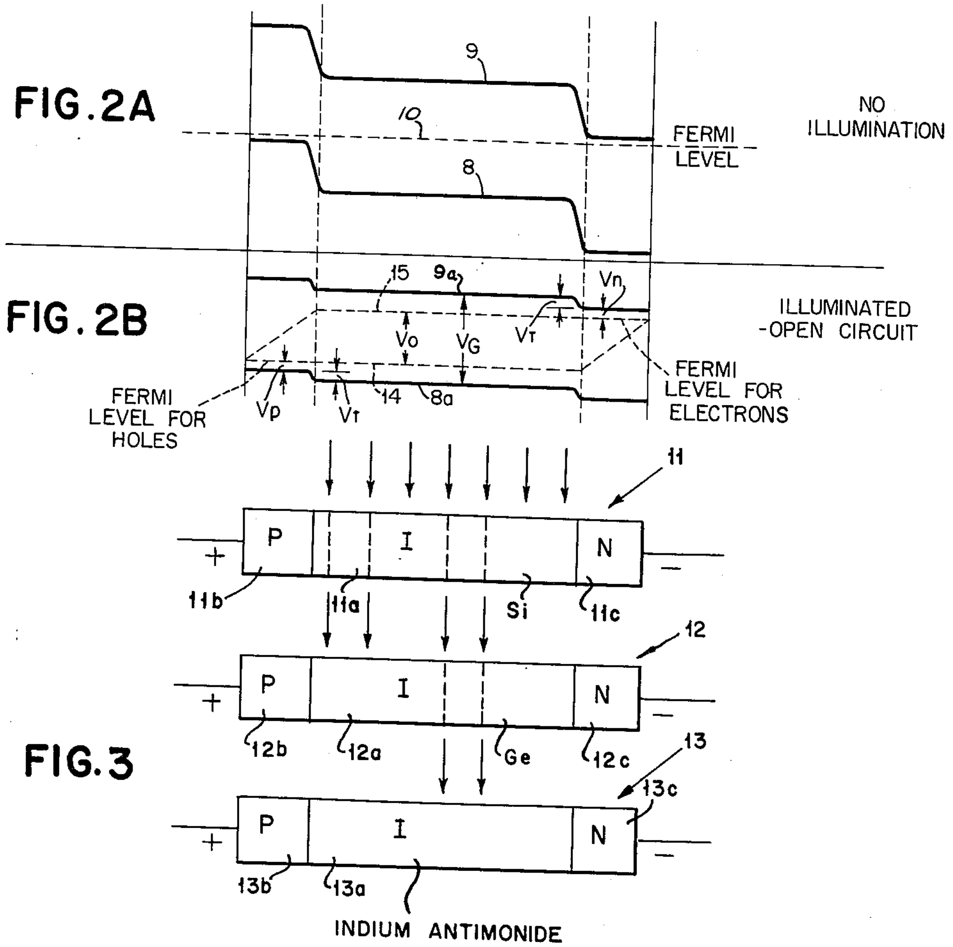
Fig. 2A is a graphical illustration of the energy levels in the semi-conductive body of Fig. 1 during conditions of no illumination.
Fig. 2B is a similar graphical illustration of the energy levels during conditions of illumination and open circuit.
Fig. 3 is a schematic illustration, generally similar to Fig. 1, illustrating a modified form of the invention.

Fig. 2A shows diagrammatically the relationship between the energy levels of the electrons in the semi-conductive material. The curve 8 represents the energy level of the upper limit of the valence band of electrons. The curve 9 represents the lower limit of the conduction band. The area between the curves 8 and 9 represents the forbidden energy band, in which no electron may stably remain. The dotted line 10 represents the Fermi level.

The Fermi level may be defined as the energy level whose probability of occupancy by an electron is ½. In other words, one-half of those electrons which are displaced from their zero-absolute-temperature energy states are at higher energy levels than the Fermi level, and one-half at lower energy levels.

In the intrinsic region 2, the Fermi level is approximately half-way between the top of the valence band and the bottom of the conduction band. See Kittel, "Introduction to Solid State Physics," page 274. In the P region, the Fermi level is closer to the top of the valence band and in the N region it is closer to the bottom of the conduction band.

When radiant energy falls on the intrinsic region 2, many of the electrons are raised to higher energy levels by the transfer of energy from the light photons. This creates additional holes, corresponding in number to the number of electrons displaced from the valence bands. The state of affairs then existing is illustrated in Fig. 2B, where the dotted line 14 represents the Fermi level for holes and the dotted line 15 represents the Fermi level for electrons. Curve 8$a$ represents the new level of the top of the valence band, and curve 9$a$ the new level of the bottom of the conduction band. In the N region 4, the level for electrons is substantially the same as it is in the intrinsic region 2. This is because there is no barrier to the flow of electrons across the junction 6 toward the N region 4. In a similar manner, the Fermi level 14 for holes in the intrinsic region 2 is substantially the same as in the adjacent P region 3, because there is no barrier to holes flowing from the intrinsic region 2 to the P region 3.

The photons of light striking the intrinsic material in the region 2 have an energy proportional to the frequency of the light. When that energy is sufficient to shift an electron from the valence band to the conduction band, a hole-electron pair is created. The holes and electrons so created diffuse through the intrinsic region 2. The junction 5 is a barrier to electrons, while holes may diffuse through that barrier. Junction 6, on the other hand, is a barrier to holes, and electrons may diffuse through it. There results a continuous flow of holes through the junction 5 and of electrons through junction 6. In other words, a continuous current flow is produced in the direction from region 4 toward region 5. If there is no external circuit between regions 3 and 4, the current flow stops when a potential difference is built up between the regions 4 and 5 substantially equal to the steady-state electrochemical potential difference between holes and electrons.

Steady-state conditions are reached when the concentration of holes and electrons increases until the rate of recombination of holes and electrons equals the rate of generation due to the light. The steady-state concentration of carriers determines an electrochemical potential difference or open circuit voltage $V_o$, which increases with concentration, approaching $V_g$ when the incident light intensity becomes sufficiently great.

This state of affairs is illustrated graphically in Fig. 2B, where the available open circuit voltage, $V_o$, is shown as the potential difference between the Fermi levels for holes and electrons. $V_g$ is the width of the forbidden band in electron volts. The practical maximum value of $V_o$ is smaller than $V_g$, the difference being $$2V_T+V_n+V_p$$

Fig. 2B illustrates this relation.

$V_n$ is the energy difference between the Fermi level for electrons and the bottom of the conduction band in the N region. $V_p$ is the energy difference between the top of the valence band and the Fermi level for holes in the P region. $V_n$ and $V_p$ may be minimized by making the P and N regions of low resistivity. However, this should not be made so small as to reduce the lifetime sufficiently to encourage the flow of the "wrong" carriers past the respective junctions.

The energy $V_T$ is known as the "thermal voltage." It is sometimes indicated by the expression $kT$, $k$ being the Boltzmann constant and T the temperature in degrees Kelvin. At room temperature, $V_T=1/40$ electron volt. Voltages at least as large as $V_T$ must be maintained at each junction in order to inhibit the flow of the unwanted type of carrier through the junction.

Energy may be derived from the photo-cell 1 by connecting an external impedance 7 across it. If the impedance 7 is chosen to maximize the product of current and voltage for a given incident light intensity, and if $L^\tau>>W$, then the potential difference between the ends of the photo-cell remains substantially equal to the electrochemical potential difference $V_o$. If the incident light intensity is sufficiently great, $V_o$ may approach the gap width $V_g$ with the limitations mentioned above, and then the electrical efficiency of the device is nearly unity.

If the wave length of the incident light is substantially such that the energy of each light photon is only slightly greater than the width of the forbidden energy band, then each light photon is effective to generate a hole-electron pair in the intrinsic material with little heat loss, and the light energy to electrical energy conversion efficiency of the device is very nearly unity.

The light intensity should not be too great, for if too many hole-electron pairs are created, the barriers will be completely "washed out," allowing the "wrong" types of carriers to flow past the respective junctions. In actual practice, there is very little danger of this effect, at least with intensities no greater than that of direct sunlight. If a device is desired to operate in such a high intensity situation, then the thickness may be increased beyond the values indicated above as being suitable, to provide additional volumetric capacity for the additional carriers.

By way of example, a photoelectric cell constructed in accordance with the invention may have the following specifications:

$W=1/2$ cm.
$D=0.1$ cm.
$\tau=1000$ $\mu$sec.

If used in sunlight at noon, this cell has an efficiency of 5%. By increasing the intensity with reflectors, it may be raised to 15%. By decreasing W to 0.1 cm., the efficiency may be increased to 80%. Focusing of light to a strip 0.1 cm. wide is relatively easy.

With any value of W, some energy conversion will be obtained. Practical devices are, however, limited to those whose W is not substantially greater than the transport length $L^\tau$, as defined above, and best efficiencies are obtained where $W<<L^\tau$.

*Fig. 3*

This figure shows three semi-conducting bodies, numbered respectively 11, 12 and 13 with incident light shining through the three bodies in that order. The light transmitted by each body consists of photons of energy too small to create hole-electron pairs in that body. The three bodies are made of different semi-conductive materials. For example, as illustrated, the body 11 is made of silicon, the body 12 of germanium, and the body 13 of indium antimonide.

The three bodies 11, 12 and 13 have central intrinsic regions **11*a*, 12*a* and 13*a*, P regions 11*b*, 12*b* and 13*b* on their left hand ends, and N regions 11*c*, 12*c* and 13*c*** on their right hand ends. Because of the different materials used in their intrinsic regions, the three semi-conductors of Fig. 3 have forbidden energy bands of different width, and hence respond most efficiently to wave lengths of different width. By matching the width of the forbidden energy bands with the wave lengths of the incident light, a composite light of many wave lengths may be converted into electricity very efficiently. It is desirable to have the light of the shortest wave lengths absorbed and converted by the semi-conductor nearest the light, while the light of progressively longer wave lengths having greater penetrating power, is converted by the subsequent semi-conductors.

In order to maintain the output potentials equal or nearly equal to the gap widths, the light intensity must be kept fairly high. If the light intensity is increased beyond the minimum value necessary for that purpose, there is little corresponding increase in output. Consequently, the best efficiency is attained by keeping the light intensity just above that minimum value.

It may be desirable to use a system of reflectors such that light reflected from the surface of a semi-conductor is returned to and again focused upon that surface, so as to reduce reflection loss to a minimum.

If higher potentials are required (the forbidden energy band width in germanium is about 0.72 electron volt), the batteries of the photoelectric cells may be arranged in series.

While light has been mentioned as the radiant energy concerned with the embodiment of the invention disclosed above, other types of radiant energy may be employed. For example, the invention may be utilized to convert radioactive energy into electrical energy. The source of radioactive energy may be extrenal, or it may be embedded in the intrinsic region 2.

While barrier junctions between extrinsic and intrinsic materials of the same metal, e.g. germanium, have been shown and suggested, other types of barrier junctions with asymmetric conductivity and selective conduction of holes and electrons have been suggested and may be used to carry out the present invention.

While we have shown and described certain preferred embodiments of our invention, other modifications thereof will readily occur to those skilled in the art, and we therefore intend our invention to be limited only by the appended claims.

We claim:

1. A photovoltaic cell comprising a body of semi-conductive material including a central region of intrinsic material and two contact regions, respectively, of N-type and P-type material, said contact regions being joined to said central region by barrier junctions being spaced apart throughout their length by a substantial dimension of said intrinsic material, said dimension being in the range 0.1–0.5 cm. and no greater than the transport length of said intrinsic material, said central region having a substantial length in the direction at right angles to said dimension so as to provide a substantial surface area for said central region, said central region having a substantial thickness perpendicular to said surface area, said central region, said contact regions and said junctions cooperating, when radiant energy impinges on said surface area, to convert a substantial proportion of said radiant energy to electrical energy.

2. A photovoltaic cell as defined in claim 1 in which said dimension is substantially smaller than said transport length.

3. A photovoltaic cell as defined in claim 1 in which said thickness is greater than the depth of penetration of radiant energy from said surface area into said central region.

4. A photovoltaic cell as defined in claim 1 in which said contact regions are of a material of substantially lower resistivity than the intrinsic material of said central region.

5. A photovoltaic cell as defined in claim 1, including means for directing on said surface area radiant energy having a wave length such that each photon has an energy slightly greater than the width of the forbidden energy band of the intrinsic material of said central region.

6. Apparatus for converting radiant energy having components of different wave lengths into electrical energy, including a photovoltaic cell comprising a plurality of bodies of semi-conductive material, each body including a central region of intrinsic material and two contact regions, respectively, of N-type and P-type material, said contact regions being joined to said central region by barrier junctions, said junctions being spaced apart throughout their length by a substantial dimension of said intrinsic material of said central region, said dimension being in the range 0.1–0.5 cm. and no greater than the transport length of said intrinsic material, said central region having a substantial length in the direction at right angles to said dimension so as to provide a substantial surface area for said central region, said bodies being of different materials having forbidden energy bands of a different width corresponding to the energy of the photons of different components of the radiant energy, said bodies being mounted in alignment with said surface areas parallel and in the order of corresponding width of their forbidden energy bands and means to direct said radiant energy on the surface area of the body having the narrowest forbidden energy band, each said central region having a thickness in the direction of the incident radiant energy upon said surface area at least equal to the depth of penetration of its associated component of said radiant energy, said central region, said contact regions and said junctions cooperating when radiant energy impinges on said surface area to convert a substantial proportion of said radiant energy to electrical energy.

7. Apparatus for converting radiant energy into electrical energy comprising a photovoltaic cell comprising a central intrinsic region of semi-conductive material and two contact regions respectively of N-type and P-type material, said contact regions being joined to said central intrinsic region by barrier junctions, said junctions being spaced apart throughout their length by a substantial dimension of said semi-conductive material of said central intrinsic region, said dimension being in the range 0.1–0.5 cm. and no greater than the transport length of said semi-conductive material of said central intrinsic region, said central intrinsic region having a substantial length in the direction at right angles to said dimension so as to provide a substantial surface area for said central intrinsic region, means to direct radiant energy on said surface area, said central intrinsic region having a thickness in the direction of the radiant energy incident to said surface area at least equal to the depth of penetration of said radiant energy, and an electrical circuit including a load of substantial impedance connected to said N-type and P-type contact regions and supplied with electrical energy generated in said cell by action of said radiant energy impinging upon said surface area of said central intrinsic region.

8. A photovoltaic cell comprising a body of semi-conductive material including a central region of intrinsic material and two contact regions, respectively, of N-type and P-type material, said contact regions being joined to said region by barrier junctions, said junctions being spaced apart throughout their length by a substantial dimension of said intrinsic material of said central region, so as to provide a substantial surface area for said central region, said dimension being in the range 0.1–0.5 cm. and no greater than the transport length of said intrinsic material, said central region, said contact regions and said junctions cooperating, when radiant energy impinges on said surface area of said central region to convert a substantial proportion of said radiant energy to electrical energy.

9. A device for converting radiant energy to electrical energy comprising a photovoltaic cell comprising a body of semi-conductive material, including a central region of intrinsic material and two contact regions, respectively, of N-type and P-type material, said contact regions being joined to said central region by barrier junctions, said junctions being spaced apart throughout their length by a substantial dimension of said intrinsic material of said central region so as to provide a substantial surface area for said central region, said dimension being in the range 0.1–0.5 cm. and no greater than the transport length of said intrinsic material of said central region, said central region, said contact regions and said junctions cooperating, when radiant energy impinges on said surface area of said central region, to convert a substantial proportion of said radiant energy to electrical energy and an electric circuit including said cell as its only source of electrical energy and a load of substantial impedance connected to said N-type and P-type contact regions.

10. A method of converting radiant energy to electrical energy which comprises providing a body of semiconductive material having a central intrinsic region and two adjacent extrinsic contact regions on either side of said central region, one of said extrinsic contact regions being N-type and joined to said central intrinsic region by a barrier junction and the other of said extrinsic regions being P-type and joined to said central intrinsic region by a barrier junction and exposing said central intrinsic region to incident radiant energy whereby an electric potential difference is developed across said central intrinsic region at said barrier junctions.

11. A method in accordance with claim 10 wherein voltages at least as large as $kT$ are maintained at said junctions, $k$ being in the Boltzmann constant and T the temperature of said body in degrees Kelvin.

References Cited in the file of this patent

UNITED STATES PATENTS

| | | |
|---|---|---|
| 2,582,850 | Rose | Jan. 15, 1952 |
| 2,623,105 | Shockley et al. | Dec. 23, 1952 |
| 2,740,901 | Graham | Apr. 3, 1956 |
| 2,794,863 | Van Roosbroeck | June 4, 1957 |
| 2,831,981 | Watts | Apr. 22, 1958 |

OTHER REFERENCES

Rittner: "Physical Review," vol. 96, No. 6, pp. 1708, 1709, Dec. 15, 1954.

Shockley: "The Transistor," pp. 26–35 (1951).

W. Shockley: "Transistor Electronics," Proc. I.R.E. vol. 40, November 1952, pp. 1311 and 1312.